(12) United States Patent
Cesky et al.

(10) Patent No.: US 7,538,625 B2
(45) Date of Patent: May 26, 2009

(54) METHOD AND ENHANCED PHASE LOCKED LOOP CIRCUITS FOR IMPLEMENTING EFFECTIVE TESTING

(75) Inventors: Michael David Cesky, Rochester, MN (US); James David Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 11/679,323

(22) Filed: Feb. 27, 2007

(65) Prior Publication Data

US 2008/0204154 A1    Aug. 28, 2008

(51) Int. Cl.
*H03L 7/00* (2006.01)
*H03L 7/06* (2006.01)
(52) U.S. Cl. .............. 331/51; 331/18; 331/25; 331/16; 327/156; 327/157
(58) Field of Classification Search .......... 331/18, 331/25, 16, 34, 51, 10
See application file for complete search history.

(56) References Cited

U.S. PATENT DOCUMENTS 5,757,240 A  *  5/1998  Boerstler et al. .............. 331/34
2008/0007348 A1    1/2008  Huang et al.

* cited by examiner

*Primary Examiner*—Rexford Barnie
*Assistant Examiner*—Thienvu V Tran
(74) *Attorney, Agent, or Firm*—Joan Pennington

(57) ABSTRACT

A method and enhanced phase-locked loop (PLL) circuit enable effective testing of the PLL. A phase frequency detector generates a differential signal, receiving a reference signal and a feedback signal of an output signal of the PLL circuit. A charge pump is coupled to the phase frequency detector receiving the differential signal. The charge pump applies either negative or positive charge pulses to a low-pass filter, which generates a tuning voltage input applied to a voltage controlled oscillator. A first divider is coupled to the voltage controlled oscillator receives and divides down the VCO output signal, providing the output signal of the PLL circuit. A second divider receives the output signal of the PLL circuit and provides the feedback signal to the phase frequency detector. The output signal of PLL circuit is applied to a clock distribution.

12 Claims, 4 Drawing Sheets

PRIOR ART

PRIOR ART

| FOUT (MHZ) | FRACTIONAL-N DIVIDER (F=1...5, K=1, N=10) | FVCO(MHZ) |
|---|---|---|
| 750 | (10+1/1) | 7575 |
| 750 | (10+1/2) | 7875 |
| 750 | (10+1/3) | 7750 |
| 750 | (10+1/4) | 7687.5 |
| 750 | (10+1/5) | 7650 |

FIG. 4

METHOD AND ENHANCED PHASE LOCKED LOOP CIRCUITS FOR IMPLEMENTING EFFECTIVE TESTING

FIELD OF THE INVENTION

The present invention relates generally to the data processing field, and more particularly, relates to a method and apparatus for implementing enhanced phase-locked loop (PLL) circuits enabling effective testing.

DESCRIPTION OF THE RELATED ART

Phase-Locked Loop circuits are used in frequency synthesizers to provide an output signal that has a selectable, precise, and stable frequency with low frequency spurs and good phase noise. The phase-locked loop output signal may connect to the clock distribution of a games or server processor chip or provide the clock for a high speed IO interface and many other applications.

When a PLL is locked, a simple phase-frequency detector can send out a small glitching pulse every reference clock cycle. The charge pump reacts to this glitch the same way it reacts to any other input, it changes the control voltage and current, which causes a glitch in the control voltage and charge pump current. This causes the VCO frequency to change.

Phase-Locked Loops are designed, optimized, and characterized within the scope and specifications of the chips they are integrated in; the robustness of the design is rarely tested. During a time when chip designs are being used in many applications, only slightly altered, knowing the full strength and capabilities of components within the chip, especially phase-locked loops, becomes more beneficial to circuit designers. A need exists to characterize the robustness of phase-locked loops and to create a design that enables effective phase-locked loop characterization.

During phase-locked loop characterization, it is essential to run exercisers on the rest of the chip while taking characterization measurements for the phase-locked loop circuit. Exercisers including various host programs and interactive utilities are used in a comprehensive test strategy and system verification testing for hardware (HW), software and firmware (FW) elements in integrated circuit chips and systems. Existing exercisers such as Trash, IDE, TNK, HTX or AVP can be used for chip testing during phase-locked loop characterization.

Exercisers run commands simultaneously and continuously on chips creating noise, the created noise generates jitter within phase-locked loops. For example, the noise from running a microprocessor with the exercisers or during functional operation is difficult to recreate in a test site or pad cage environment.

Exercisers will stop running or crash when one tries to input a frequency greater than the chip can handle; this is a dilemma in fully testing the robustness of phase-locked loops because traditionally, phase-locked loops are capable of running significantly faster than the rest of the chip. For single-use chips, the phase-locked loop would not be fully tested outside the chips frequency range.

However, with today's multiple applications for chips, to identify the limitations and capabilities of phase-locked loop designs would be very beneficial. Therefore, a design that provides the ability to test the phase-locked loops at frequencies above the chips frequency range while still running exercisers is necessary.

SUMMARY OF THE INVENTION

A principal aspect of the present invention is to provide a method and enhanced phase-locked loop (PLL) circuit for implementing effective testing. Other important aspects of the present invention are to provide such method and enhanced phase-locked loop (PLL) circuit substantially without negative effect and that overcome many of the disadvantages of prior art arrangements.

In brief, a method and enhanced phase-locked loop (PLL) circuit are provided for implementing effective testing. A phase frequency detector generates a differential signal, receiving a reference signal and a feedback signal of an output signal of the PLL circuit. A charge pump is coupled to the phase frequency detector receiving the differential signal. The charge pump applies either negative or positive charge pulses to a low-pass filter depending on whether the reference signal phase leads or lags the phase of the output feedback signal and generates a tuning voltage input applied to a voltage controlled oscillator. A first divider is coupled to the voltage controlled oscillator receives and divides down the VCO output signal, providing the output signal of the PLL circuit. A second divider receives the output signal of the PLL circuit and provides the feedback signal to the phase frequency detector. The output signal of PLL circuit is applied to a clock distribution.

In accordance with features of the invention, the first divider is a fractional-N divider. The first divider allows the phase-locked loop VCO output signal to vary in a frequency range much greater than a maximum frequency at the clock tree. The output signal of the PLL circuit is N-divided and compared to the reference signal at the phase frequency detector.

In accordance with features of the invention, the phase-locked loop is enabled to vary in frequency range significantly higher than the frequency capabilities of the clock tree, while maintaining the use of exercises and the generation of real noise during testing the phase-locked loop. The robustness of the phase-locked loop circuit can be tested and its usefulness in multiple applications can be identified.

BRIEF DESCRIPTION OF THE DRAWINGS

The present invention together with the above and other objects and advantages may best be understood from the following detailed description of the preferred embodiments of the invention illustrated in the drawings, wherein:

FIG. 4 illustrates exemplary operation of the first divider of the phase-locked loop circuit of FIG. 3 in accordance with the preferred embodiment.

DETAILED DESCRIPTION OF THE PREFERRED EMBODIMENTS

Figure 1:
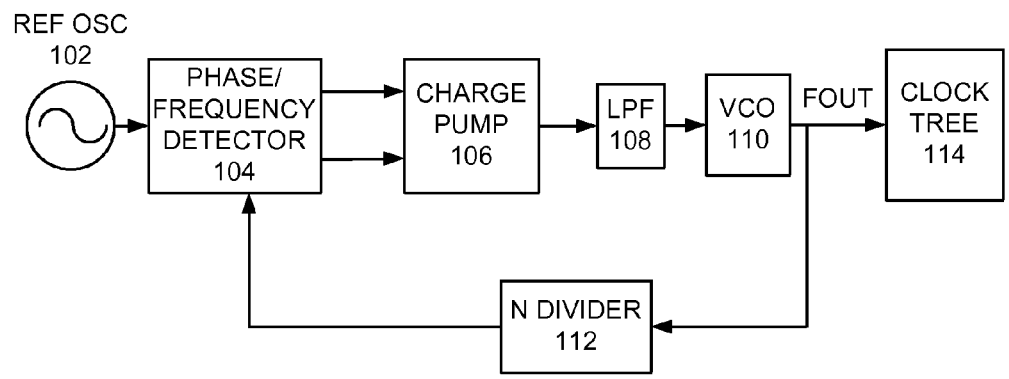
FIG. 1 is a prior art phase-locked loop circuit including a feedback N divider.

FIG. 1 illustrates a basic phase-locked loop circuit. The basic phase-locked loop circuit receives a reference signal from a reference oscillator 102, and includes a phase/frequency detector 104 coupled to a charge pump 106, a low-pass filter (LPF) 108, a voltage-controlled oscillator 110, and a feedback divider or N divider 112. The phase/frequency detector 104 takes a reference signal and generates an output voltage that is proportional to the phase difference between the input reference signal and the output signal fed back from the VCO 110. The charge pump 106 then delivers either positive or negative charge pulses to the low-pass filter 108 depending on whether the reference signal leads or lags the phase of the feedback of the VCO output signal. These charge pulses are integrated by the low-pass filter 108 to generate a tuning voltage input into the VCO 110. The output frequency of the VCO 110 moves up or down based upon the tuning voltage in order to synchronize with the reference signal. Typically, the tuning voltage from the loop filter 108 moves higher or more positive to advance the VCO output phase and make its frequency higher and vice versa for the down voltages. The VCO output signal, FOUT, is related to the reference signal, FREF by the relationship FOUT=N*FREF, where N represents the feedback divider 112. Table 1 shows frequencies attainable with integer-N dividers.

TABLE 1

| FREF (MHz) | Integer-N (N = 2 ... 6) | FOUT (MHz) |
| --- | --- | --- |
| 10 | 2 | 20 |
| 10 | 3 | 30 |
| 10 | 4 | 40 |
| 10 | 5 | 50 |
| 10 | 6 | 60 |

In a basic design, the phase-locked loop varies in frequency, the clock distribution of a game or server processor chip, high speed IO interface, or other application is fixed in frequency, and the feedback divider to the phase-locked loop is a fixed integer, N, value. This setup does not allow the phase-locked loop to run at frequencies greater than the clock tree paths can handle. With the N divider, N is an integer and therefore, the smallest increment in the VCO output frequency value is equal to the magnitude of the reference frequency. In order to have small step sizes between adjacent output frequencies, a very low reference frequency would be required. This, however, would introduce a limited frequency range and a long settling time for the phase-locked loop. A low reference frequency does not allow characterizing the inter-chip interfaces at high frequencies.

Figure 2:
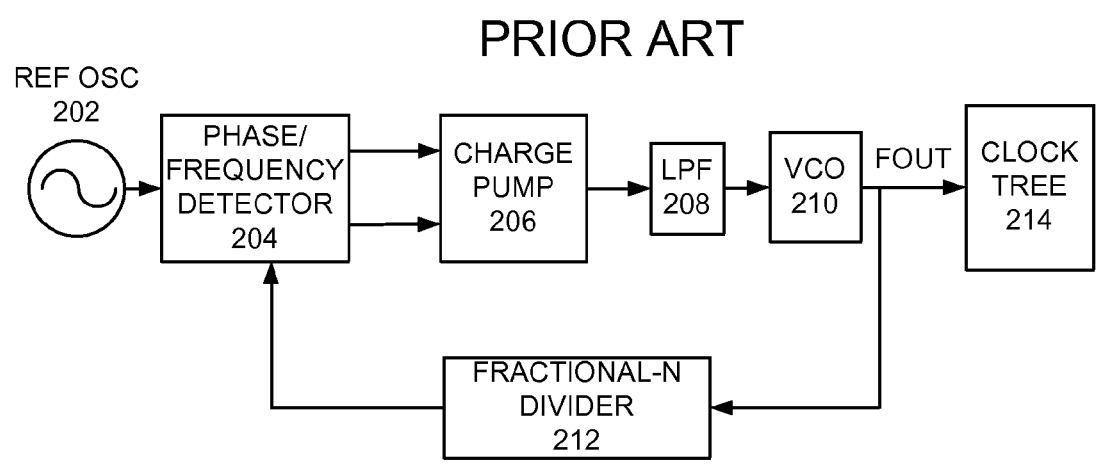
FIG. 2 is a prior art phase-locked loop circuit including a feedback fractional-N divider.

FIG. 2 illustrates a conventional fractional-N divider that is needed to provide a rational multiple of the reference signal frequency and allow for smaller step sizes. The basic fractional-N divider phase-locked loop circuit receives a reference signal from a reference oscillator 202, and includes a phase/frequency detector 204 coupled to a charge pump 206, a low-pass filter (LPF) 208, a voltage-controlled oscillator 210, and a feedback divider or fractional-N divider 212. In a basic fractional-N phased-lock loop, the VCO output signal, FOUT is related to the reference signal, FREF, by the relationship FOUT=FREF*(N+K/F), where N is the integer divider, F is the fractional modulus of the circuit, such as an 8 would indicate a $\frac{1}{8}^{th}$ fractional resolution, and K is the fractional channel of operation. Table 2 shows frequencies attainable with fractional-N dividers.

TABLE 2

| $F_{REF}$ (MHz) | Fractional-N (F = 1 ... 5, K = 1, N = 10) | $F_{VCO}$ (MHz) |
| --- | --- | --- |
| 10 | (10 + ½) | 110 |
| 10 | (10 + ½) | 105 |

TABLE 2-continued

| $F_{REF}$ (MHz) | Fractional-N (F = 1 ... 5, K = 1, N = 10) | $F_{VCO}$ (MHz) |
| --- | --- | --- |
| 10 | (10 + ⅓) | 103.33 |
| 10 | (10 + ¼) | 102.5 |
| 10 | (10 + ⅕) | 102 |

In accordance with features of the invention, a method and phase-locked loop (PLL) circuit are provided for testing the robustness of the PLL design. The phase-locked loop (PLL) circuit of the invention enables the complete and effective characterization of components within the chip, specifically including the phase-locked loop. This invention allows the robustness of the phase-locked loop to be fully tested. By altering the loop in the phase-locked loop to include a fractional-N divider prior to the clock distribution tree and an integer-N divider prior to the phase/frequency detector, it is possible with the phase-locked loop (PLL) circuit of the invention to fully characterize the phase-locked loop while still running exercisers.

Figure 3:
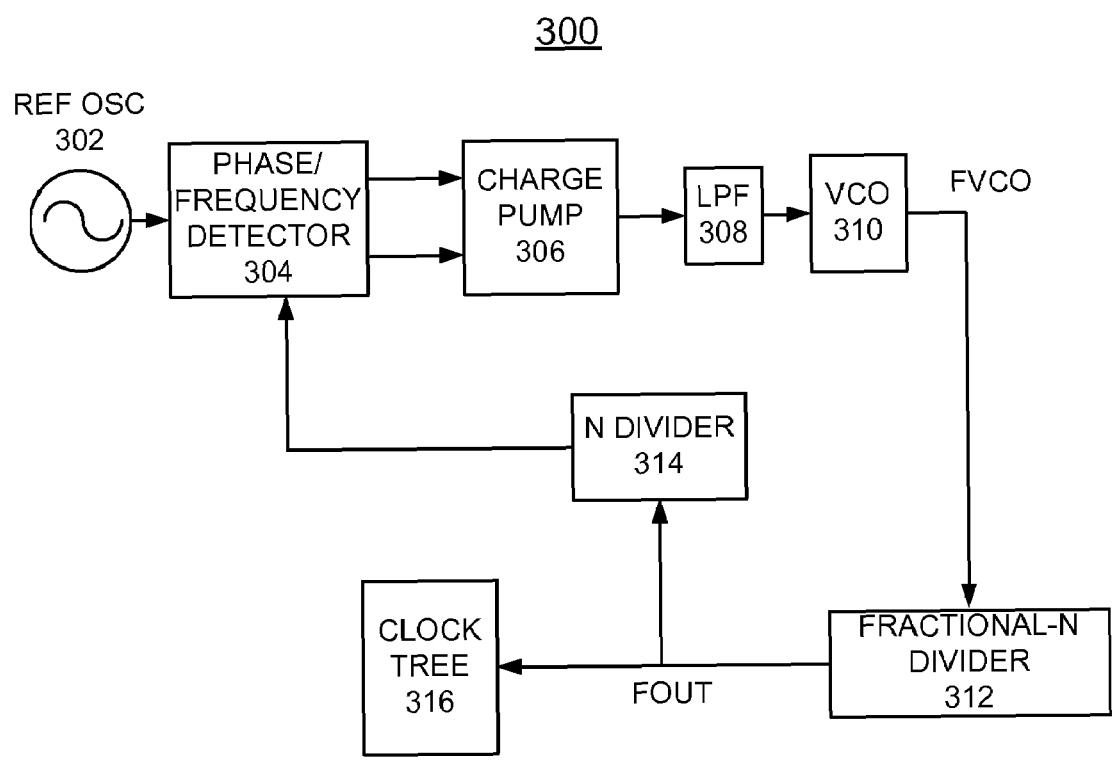
FIG. 3 illustrates an exemplary phase-locked loop circuit including a first and second divider in accordance with the preferred embodiment.

Having reference now to the drawings, in FIG. 3, there is shown an exemplary phase-locked loop (PLL) circuit generally designated by the reference character 300 in accordance with the preferred embodiment. The phase-locked loop (PLL) circuit 300 is arranged for implementing enabling effective testing in accordance with the preferred embodiment. The PLL circuit 300 includes a reference oscillator 302 coupled to a phase frequency detector The phase frequency detector 304 generates a differential signal, receiving a reference signal and a feedback signal of an output signal of the PLL circuit 300. A charge pump 306 is coupled to the phase frequency detector 304 receiving the differential signal. The charge pump 306 applies either negative or positive charge pulses to a low-pass filter 308 depending on whether the reference signal phase leads or lags the phase of the output feedback signal and generates a tuning voltage input applied to a voltage controlled oscillator (VCO) 310.

A first divider 312 coupled to the voltage controlled oscillator (VCO) 310, receives and divides down the VCO output signal, providing the output signal FOUT of the PLL circuit 300. The PLL circuit 300 includes a second divider 314 receives the output signal of the PLL circuit and provides the feedback signal to the phase frequency detector 304. The output signal FOUT of the PLL circuit 300 is applied to a clock distribution or clock tree 316.

In accordance with features of the invention, the phase-locked loop (PLL) circuit 300 includes the reference signal entering the phase-locked loop as normal, and exiting to a fractional-N divider. This added fractional-N divider 312 allows the operation frequency of the phase-locked loop to vary significantly while still maintaining a fixed frequency FOUT at the clock tree 316. The location of FOUT that the clock tree normally sees is now after the fractional-N divider 312. The FOUT signal is also N-divided and compared to the reference signal at the phase frequency detector 304 like a typical phase-locked loop. The new loop configuration of the phase-locked loop (PLL) circuit 300 allows the phase-locked loop to vary in frequency range well outside the capabilities of the clock tree 316, thus, maintaining the use of exercises and the generation of real noise to the phase-locked loop. The robustness of the phase-locked loop circuit 300 can now be tested and its usefulness in multiple applications can be realized. Also, the need for separate hardware to characterize the phase-locked loop circuit 300 and understand its usefulness is not as urgent and necessary. This new design makes transitions to a new application and reuse of the current design for separate chips easier for phase-locked loop designers.

In the PLL circuit 300, the first divider 312 of the preferred embodiment is a fractional-N divider. The second divider 314 is an integer-N divider and is the feedback divider of the PLL circuit 300.

The VCO output signal, FVCO is related to the output signal, FOUT, by the relationship FVCO=FOUT*(N+K/F), where N is an integer, F is the fractional modulus of the fractional-N divider 312, and K/F represents fractional resolution such as with, K of 1 and F equal to 8 indicates a $\frac{1}{8}^{th}$ fractional resolution.

FIG. 4 shows exemplary frequencies attainable with fractional-N divider As can be appreciated from FIG. 4, the VCO output signal, FVCO, is divided down by the fractional-N divider 312 to provide the output signal, FOUT that is applied to the clock tree 316.

The new loop configuration of PLL circuit 300 allows the phase-locked loop VCO output signal to vary in frequency range much greater than the capabilities of the clock tree 316, thus, maintaining the use of exercises and the generation of real noise to the phase-locked loop being tested and fully characterized. The previous PLL designs, such as shown in FIGS. 1 and 2, would cause exercisers to crash and halt the generation of real noise from the rest of the chip.

While the present invention has been described with reference to the details of the embodiments of the invention shown in the drawing, these details are not intended to limit the scope of the invention as claimed in the appended claims.

What is claimed is:

1. A phase-locked loop (PLL) circuit comprising:
a phase frequency detector receiving a reference signal and a feedback signal of an output signal of the PLL circuit, said phase frequency detector generating a differential signal,
a charge pump coupled to said phase frequency detector receiving said differential signal, said charge pump generating either negative or positive charge pulses responsive to said reference signal and said output feedback signal,
a low-pass filter coupled to said charge pump, said low-pass filter generating a tuning voltage,
a voltage controlled oscillator coupled to said low-pass filter receiving said tuning voltage, said voltage controlled oscillator generating a VCO output signal,
a first divider coupled to the voltage controlled oscillator receiving and dividing down said VCO output signal, said first divider providing the output signal of the PLL circuit;
a second divider receiving the output signal of the PLL circuit and providing said feedback signal to said phase frequency detector; and the output signal of the PLL circuit being applied to a clock tree, and
wherein said first divider is configured to allow the phase-locked loop VCO output signal to vary in a frequency range much greater than a maximum frequency at the clock tree.

2. The phase-locked loop (PLL) circuit as recited in claim 1 wherein said first divider is a fractional-N divider.

3. The phase-locked loop (PLL) circuit as recited in claim 1 wherein said output signal of PLL circuit is N-divided by said second divider and compared to the reference signal by said phase frequency detector.

4. The phase-locked loop (PLL) circuit as recited in claim 1 wherein said second divider is an integer-N divider.

5. A phase-locked loop (PLL) circuit comprising:
a phase frequency detector receiving a reference signal and a feedback signal of an output signal of the PLL circuit, said phase frequency detector generating a differential signal,
a charge pump coupled to said phase frequency detector receiving said differential signal, said charge pump generating either negative or positive charge pulses responsive to said reference signal and said output feedback signal,
a low-pass filter coupled to said charge pump, said low-pass filter generating a tuning voltage,
a voltage controlled oscillator coupled to said low-pass filter receiving said tuning voltage, said voltage controlled oscillator generating a VCO output signal,
a first divider coupled to the voltage controlled oscillator receiving and dividing down said VCO output signal, said first divider providing the output signal of the PLL circuit;
a second divider receiving the output signal of the PLL circuit and providing said feedback signal to said phase frequency detector; and the output signal of the PLL circuit being applied to a clock tree, and
said phase-locked loop VCO output signal having an operating frequency range greater than a maximum frequency at the clock tree, enabling the use of exercisers and noise generation during phase-locked loop testing within said operating frequency range.

6. The phase-locked loop (PLL) circuit as recited in claim 5 wherein said first divider is a fractional-N divider, said fractional-N divider represented by (N+K/F), where N represents an integer, F represents a fractional modulus, and K/F represents a fractional resolution of said first divider.

7. A method for implementing testing of a phase-locked loop (PLL) circuit including a phase frequency detector receiving a reference signal and a feedback signal of an output sinal of the PLL circuit, said phase frequency detector generating a differential signal, a charge pump coupled to said phase frequency detector receiving said differential signal, said charge pump generating either negative or positive charge pulses responsive to said reference signal and said output feedback signal, a low-pass filter coupled to said charge pump, said low-pass filter generating a tuning voltage, a voltage controlled oscillator coupled to said low-pass filter receiving said tuning voltage, said voltage controlled oscillator generating a VCO output signal, said method comprising the steps of:
providing a first divider coupled to the voltage controlled oscillator receiving and dividing down said VCO output signal, said first divider providing the output signal of the PLL circuit, and
providing a second divider coupled to said first divider receiving the output signal of the PLL circuit and providing the feedback signal to said frequency detector;
applying the first divider output signal of PLL circuit to a clock tree; and said phase-locked loop VCO output signal having an operating frequency range greater than a maximum frequency at the clock tree, further enabling the use of exercisers and noise generation during phase-locked loop testing within said operating frequency range.

8. The method for testing a phase-locked loop (PLL) circuit as recited in claim 7 wherein providing said first divider includes providing a fractional-N divider.

9. The method for testing a phase-locked loop (PLL) circuit as recited in claim 8 wherein said fractional-N divider represented by (N+K/F), where N represents an integer, F represents a fractional modulus, and K/F represents a fractional resolution of said first divider.

10. The method for testing a phase-locked loop (PLL) circuit as recited in claim 7 wherein providing said second divider includes providing an integer-N divider.

11. The method for testing a phase-locked loop (PLL) circuit as recited in claim 10 wherein said output signal of PLL circuit is N-divided by said second divider and the N-divided output signal is compared to the reference signal by the phase frequency detector.

12. The method for testing a phase-locked loop (PLL) circuit as recited in claim 7 wherein said first divider allows the phase-locked loop VCO output signal to vary in a frequency range much greater than a maximum frequency at the clock tree.

* * * * *